United States Patent [19]

Makino et al.

[11] Patent Number: 4,782,002
[45] Date of Patent: Nov. 1, 1988

[54] PHOTO AND PRESSURE SENSITIVE RECORDING MEDIA

[75] Inventors: Kuniyasu Makino; Jun Sakai, both of Nagoya, Japan

[73] Assignee: Brother Kogyo Kabushiki Kaisha, Nagoya, Japan

[21] Appl. No.: 79,713

[22] Filed: Jul. 30, 1987

[30] Foreign Application Priority Data

Jul. 31, 1986 [JP] Japan .................................. 61-181271

[51] Int. Cl.$^4$ .......................... G03C 1/72; G03C 1/495; G03C 1/68
[52] U.S. Cl. ..................................... 430/138; 427/212; 430/151; 430/202; 430/212; 430/253
[58] Field of Search ............... 430/138, 202, 253, 212, 430/151; 427/212

[56] References Cited

U.S. PATENT DOCUMENTS

| | | | |
|---|---|---|---|
| 4,483,912 | 11/1984 | Sanders et al. | 430/138 |
| 4,598,035 | 7/1986 | Usami et al. | 430/138 |
| 4,687,725 | 8/1987 | Wright et al. | 430/138 |

Primary Examiner—Mukund J. Shah
Attorney, Agent, or Firm—Kane, Dalsimer, Sullivan, Kurucz, Levy, Eisele and Richard

[57] ABSTRACT

A photo and pressure sensitive recording medium comprising a sheet shaped supporting member, microcapsules enveloping therein at least image developing materials and photo-sensitive resins, and plastic grains having large diameter than that of the microcapsule and being softenable when exposed to external energy. The microcapsules and the plastic grains are mixedly distributed and coated on one surface of said supporting member.

Since the plastic grains are not softened until they are subjected to the external energy such as heat, light and so on, the microcapsules smaller than the plastic grains can be prevented from unintentional rupturing by fingers of operators or so during the transportation or so of the recording medium even though the microcapsules are prepared to be ruptuable by small pressure such as the pressure applied by the fingers or so.

11 Claims, 1 Drawing Sheet

PHOTO AND PRESSURE SENSITIVE RECORDING MEDIA

BACKGROUND OF THE INVENTION

This invention relates to a photo and pressure sensitive recording medium suitable for recording an image thereon.

In the prior arts, such photo and pressure sensitive medium as being coated with microcapsules enveloping chromogenic materials and photosensitive resins have been proposed as disclosed in the U.S. Pat. Nos. 4,399,209 and 4,440,846.

With these medium, in order to use for copying an image of the manuscript, a latent image thereof is formed on the medium by utilizing a light scanning on and reflected from the manuscript by hardening or softening microcapsules, then microcapsules having relatively low hardness are ruptured by pressing the medium by pressing rollers for streaming out the chromogenic material from ruptured microcapsules so as to be contact with the color developing agent for colorizing the latent image. With these prior medium, starch particles having large diameter than that of microcapsules are distributed among the microcapsules so as to prevent the unintentional rupturing of the microcapsules by, for instance, pressing them with the fingers during handling thereof. With the existence of these large starch particles, however, high pressure is required to develope the image exposed on the medium so that it becomes difficult to use a compact and small pressing roller unit therefor.

SUMMARY OF THE INVENTION

Accordingly, it is an object of this invention to provide an improved photo and pressure sensitive recording medium capable of developing the image exposed thereon with relatively low pressure while microcapsules are unrupturable before exposure with such low pressure as being applied by fingers and so on.

For the above purpose, according to this invention, there is provided a photo and pressure sensitive recording medium comprising a sheet shaped supporting member, microcapsules enveloping therein at least an image developing material and a photo-sensitive resin, and plastic grains having large diameter than that of said microcapsule and being softenable when exposed to external energy, said microcapsules and said plastic grains being mixedly distributed and coated on one surface of said supporting member.

In the first embodiment, said plastic grain comprises a thermo-plastic resin and is softened when exposed to heat.

In the second embodiment, said plastic grain comprises a photo-decomposable micromolucule and is softened when exposed to light.

Accordingly, with the recording medium of the present invention, the microcapsules can be protected by the plastic grains having large diameter until they are softened by applying external energy such as heat, light and so on. Thus, the microcapsules may be prepared to be rupturable by small pressure such as appled by the fingers while preventing the unintentional rupturing during handling it.

BRIEF DESCRIPTION OF THE ACCOMPANYING DRAWINGS

DESCRIPTION OF THE PREFERRED EMBODIMENTS

Figure 1:
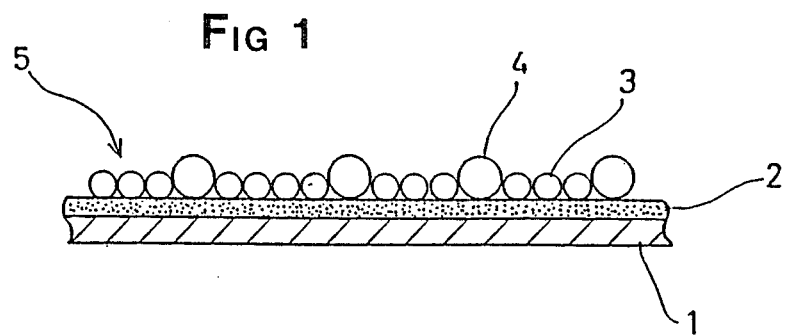
FIG. 1 is an enlarged sectional diagramatic representation showing a recording medium embodying the invention.

As shown in FIG. 1, a photo and pressure sensitive recording medium 5 embodying the invention comprises a layer 2 of color developing agent coated on a paper sheet 1, and photosensitive microcapsules 3 which are, for instance, hardened when exposed to light, and plastic grains 4 having large diameter than that of the microcapsule 3 and being softenable when exposed to heat are mixedly distributed and coated on the layer 2 of colo developing agent.

In each microcapsule 3 at least enveloped are chromogenic materials and photo-hardenable resins. As the chromogenic materials, cray organic acids, an acidec polymer, metal salts, aromonic carboxylic acids and mixtures thereof may be adopted. As the photohardenable resins, for instance, photo-polymerizable resins including ethylene type unsaturated compounds, trimethytal propane, for example an acrylate prepolymer, or the like. Photo-polymerizing intiators, photo-sensitivity promotors, heat polymerizing inhibitors and so on may be enveloped upon necessity.

As plastic grains 4, thermo-plastic resins such as polystyrene, styrene-acrylate copolymer, polyesyer, polyvinylbutyral, polyamide, polyethylene, ethylenevinylacetate copolymer and so on may be utilized.

With this recording medium 5, as the hardness of the plastic grains 4 is high under the room temperature, it is prevented by the plastic grains 4 that the microcapsules 3 which are smaller than the plastic grains 4 and coated on the same layer 2 are ruptured by small pressure such as applied by human fingers and so on.

Figures 2A, 2B:
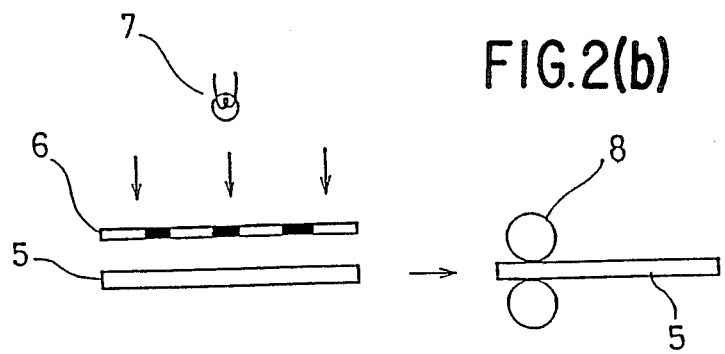
FIG. 2 is a diagrammatic representation showing an exposure and developing steps with the recording medium shown in FIG. 1.

FIG. 2 diagramatically illustrates the exposure and image development steps with the above recording medium 5 illustrated in FIG. 1, wherein 6 indicates a photo-permeable manuscript, 7 a light source and 8 a pair of pressing rollers provided with heating mesium, not shown. In these steps, the recording medium 5 is passed through the pair of pressing rollers 8 after the recording medium 5 is exposed to light by the light source 7 under the overlapped condition with the manuscript 6, and as the heat is applied to the plastic grains 4 by the pressing rollers 8, the plastic grains 4 are softened and are ruptured together with the microcapsules 3 except the hardened microcapsules 3 with relatively low pressure applied by the pressing rollers 8. Then the chromogenic materials enveloped in the microcapsules 3 which are not exposed to light and ruptured by the rollers 8 stream out of the microcapsules and react with the color developing agents 2 on the supporting sheet. Thus the latent image formed on the recording medium 5 in the exposure step is developed to a visible color image.

Although in the aforementioned embodiment, the plastic grains 4 are softened when exposed to heat, plastic grains which are decomposed and softened when exposed to light can be instead used. As this kind of plastic grains, photo-decomposable macromolecules such as polymethyl vinyl keton; polyvinyl phenyl keton; block copolymer thereof with ethylene, styrene, vinyl chloride or acryl; polysulfone; and so on are utilized.

With the recording medium 5 coated with the above type plastic grains, as the plastic grains 4 are not ruptured until the recording medium 5 is exposed to the light by the light source 7 under the overlapped condition with the manuscript 6, the microcapsules 3 can be prevented from unintentional rupturing during handling thereof. Further, as the plastic grains 4 are softened and are ruptured together with the microcapsules 3 except the hardened microcapsules 3 with relatively low pressure applied by the pressing rollers 8. In this case, it is of course unnecessary to heat the pair of rollers 8. Moreover, other plastic grains which are softenable by the external energy such as radioactive rays and so on can be of course adopted.

Further, although in the above embodiment photo-hardenable microcapsules 3 are utilized, photo-curable microcapsules enveloping photo-softenable resin can of course be utilized.

Moreover, although in the above embodiment, chromogenic materials are enveloped in the microcapsules 3 while color developing agent is coated on the surface of the paper sheet 1 so as to develop an image when the microcapsules 3 are ruptured by the pressing rollers 8 by the reaction between the chromogenic materials and color developing agents, decolorizing agents may be enveloped in the microcapsules instead of chromogenic materials and the surface of the sheet 1 may be colored beforehand instead of coating the color developing agents thereon. With this modification, the surface of the sheet 1 is decolorized when the microcapsules 3 are ruptured and thus the latent image is then developed on the surface of the sheet 1.

Figures 3A, 3B:
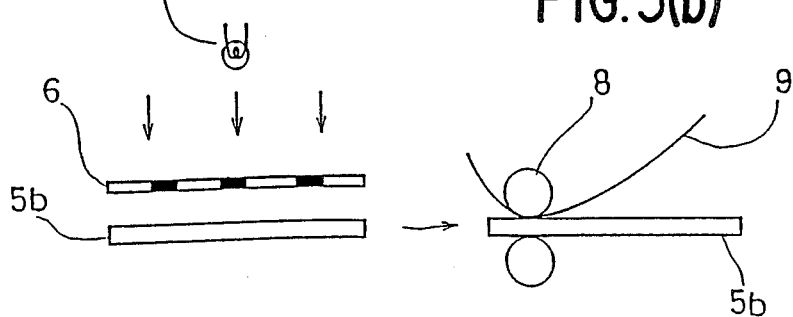
FIG. 3 is a diagrammatic representation showing an exposure and developing steps with the recording medium of another embodiment of the invention.

FIG. 3 shows other embodiment of the present invention. In this embodiment, an image-transfer-type recording medium 5b is disclosed. This recording medium 5b comprises microcapsules 3 and plastic grains 4 are mixedly distributed and coated on the paper sheet 1, while the color developing agents are coated on a transfer medium 9. This recording medium 5b is after exposed to light passed through the pair of pressing rollers 8 under the overlapped condition with the transfer medium 9 with the coated surfaces of both mediums 5b and 9 facing each other, so that the unhardened microcapsules 3 and plastic grains 4 are ruptured and chromogenic materials streamed out of the ruptured microcapsules 3 are reacted with the color developing agents coated on the transfer medium 9, thus the latent image formed on the recording medium 5b is developed on the transfer medium 9 as the visible image.

Although, in the above embodiments, the paper sheet 1 is utilized as the supporting member, other members such as a cloth and a vinyl film can be adopted. Similarly, as the transfer medium 9, the aforementioned members can be adopted while preparing the transfer-type recording medium 5b with the paper sheet as disclosed above. Thus, with these modifications, desired patterns can be printed on various subjects including dress materials, handkerchieves, post cards and so on.

As above described, with the photo and pressure sensitive recording medium embodying the invention, as the plastic grains are coated on the surface of the supporting sheet together with the microcapsules, the microcapsules are prevented from unintentional rupturing by the small pressure such as applied by the fingers or so on before exposed to light to form athe latent image thereon. On the other hand, when the image formed on the recording medium is developed, the plastic grains are softened so as to be ruptured by the small pressure.

What is claimed is:

1. A photo and pressure sensitive recording medium comprising:
a sheet shaped supporting member;
microcapsules and grains mixedly distributed and coated on one surface of said supporting member;
said microcapsules enveloping therein at least image developing materials and photo-sensitive materials;
said grains being of a larger size than that of said microcapsules whereby said grains extend further outwardly from said supporting surface than said microcapsules so as to protect said microcapsules from inadvertent subjection to rupture forces and said grains being formed of a plastic material which is softenable when exposed to external energy, to permit exposure of said microcapsules to rupture forces.

2. The recording medium according to claim 1 wherein said image developing materials are chromogenic materials.

3. The recording medium according to claim 1 wherein said image developing materials are decolorizing agents.

4. The recording medium according to claim 1 wherein said plastic grain comprises thermo-plastic resin and said external energy comprises heat.

5. The recording medium according to claim 4 wherein said thermo-plastic resin is selected from the group consisting of polystyrene, styrene-acrylate copolymer, polyesyer, polyvinylbutyral, polyamide, polyethylene, and ethylene-vinylacetate copolymer.

6. The recording medium according to claim 1 wherein said plastic grain comprises photo-decomposable macromolecule and said external energy comprises light.

7. The recording medium according to claim 6 wherein said photo-decomposable macromolecule is selected from the group consisting of polymethyl vinyl keton; polyvinyl phenyl keton; block copolymer thereof with ethylene, styrene, vinyl chloride or acryl; and polysulfone.

8. The recording medium according to claim 1 wherein said photo-sensitive resin comprises a photo-softenable resin and said microcapsules are softened when exposed to light.

9. The recording medium according to claim 1 wherein said photo-sensitive resin comprises a photo-hardenable resin and said microcapsules are hardened when exposed to light.

10. The recording medium according to claim 2 which further comprises a layer of color development agents formed between said surface of said supporting member and said microcapsules and plastic grains.

11. The recording medium according to claim 3 wherein said surface of the supporting member is colored.

* * * * *